(12) United States Patent
Jung et al.

(10) Patent No.: US 9,460,888 B2
(45) Date of Patent: Oct. 4, 2016

(54) ELECTRON BEAM GENERATOR, IMAGE APPARATUS INCLUDING THE SAME AND OPTICAL APPARATUS

(71) Applicant: ELECTRONICS AND TELECOMMUNICATIONS RESEARCH INSTITUTE, Daejeon (KR)

(72) Inventors: Moon Youn Jung, Daejeon (KR); Dong Hoon Song, Daejeon (KR); Jin Sun Kim, Cheonan (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/059,199

(22) Filed: Mar. 2, 2016

(65) Prior Publication Data

US 2016/0260575 A1    Sep. 8, 2016

(30) Foreign Application Priority Data

Mar. 6, 2015 (KR) .......................... 10-2015-0031478
Jan. 13, 2016 (KR) .......................... 10-2016-0004357

(51) Int. Cl.
*H01J 37/06* (2006.01)
*H01J 37/244* (2006.01)

(52) U.S. Cl.
CPC .............. *H01J 37/06* (2013.01); *H01J 37/244* (2013.01)

(58) Field of Classification Search
USPC .......................................... 250/423 R, 423 P
See application file for complete search history.

(56) References Cited

U.S. PATENT DOCUMENTS 5,122,663 A     6/1992 Chang et al.
2012/0151508 A1*  6/2012 Komma ............... G11B 7/1381
                                                            720/695

\* cited by examiner

*Primary Examiner* — Kiet T Nguyen

(57) ABSTRACT

Provided may include an electron beam generator, an image apparatus including the same, and an optical apparatus. The optical apparatus includes a first and second laser apparatuses providing a first and second laser beams on a substrate, and a first optical system provided between the first and second laser apparatuses and the substrate to focus the first and second laser beams. The first and second laser beams overlap with each other generating an interference beam, thereby decreasing a spot size of the interference beam to be smaller than a wavelength of each of the first and second laser beams at a focal point.

20 Claims, 12 Drawing Sheets

ELECTRON BEAM GENERATOR, IMAGE APPARATUS INCLUDING THE SAME AND OPTICAL APPARATUS

CROSS-REFERENCE TO RELATED APPLICATIONS

This U.S. non-provisional patent application claims priority under 35 U.S.C. §119 of Korean Patent Application Nos. 10-2015-0031478, filed on Mar. 6, 2015, and 10-2016-0004357 filed on Jan. 13, 2016, the entire contents of which are hereby incorporated by reference.

BACKGROUND

The present disclosure herein relates to an image apparatus, and more particularly, to an electron beam generator and an image apparatus including the same.

In general, a surface inspection apparatus may magnify and analyze a surface of an object to be examined. For example, an optical microscope is capable of magnifying and projecting a surface image of a sample for examination. However, the optical microscope fails to magnify the surface image to a magnification of about $10^6$ to about $10^9$ or higher. An image having a narrower line width than the wavelength of source light of the optical microscope may not be examined.

SUMMARY

Exemplary embodiments of the inventive concept provide an electron beam generator capable of providing an electron beam having a narrower line width than a wavelength of a laser beam.

Exemplary embodiments of the inventive concept provide an image apparatus having a high resolution.

According to exemplary embodiments of the inventive concept, an electron beam generator may include a beam source supply unit configured to provide a beam source on a substrate; a first laser apparatus configured to provide a first laser beam to the beam source and the substrate; a first optical system having a focal point on the substrate and configured to concentrate the first laser beam on the substrate; and a second laser apparatus configured to provide a second laser beam overlapping the first laser beam between the first optical system and the first laser apparatus. The second laser apparatus may output the second laser beam which has a phase opposite to a phase of the first laser beam, and may decrease a first spot size of an interference beam generated by a destructive interference with the first laser beam to be smaller than a wavelength of the first laser beam at the focal point.

According to exemplary embodiments of the inventive concept, an image apparatus may include: an electron beam generator configured to provide an electron beam on a substrate; a detector configured to detect secondary electrons generated from the substrate using the electron beam; and a control unit configured to control the electron beam generator and obtain a substrate image according to a detection signal of the detector. The electron beam generator may include: a source supply unit configured to provide a beam source to the substrate; a first laser apparatus configured to provide a first laser beam to the beam source and the substrate; a first optical system having a focal point on the substrate and configured to concentrate the first laser beam on the substrate; and a second laser apparatus configured to provide a second laser beam overlapping the first laser beam between the first optical system and the first laser apparatus. The second laser apparatus may output the second laser beam which has a phase opposite to a phase of the first laser beam, and may decrease a first spot size of an interference beam generated by a destructive interference with the first laser beam to be smaller than a wavelength of the first laser beam at the focal point.

According to exemplary embodiments of the inventive concept, an optical apparatus may include: first and second laser apparatuses configured to provide first and second laser beams to a substrate; and a first optical system provided between the first and second laser apparatuses and the substrate, and configured to focus the first and second laser beams. The first and second laser beams may be overlapped with each other to generate an interference beam, and may decrease a spot size of the interference beam to be smaller than a wavelength of each of the first and second laser beams at a focal point of the first optical system.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
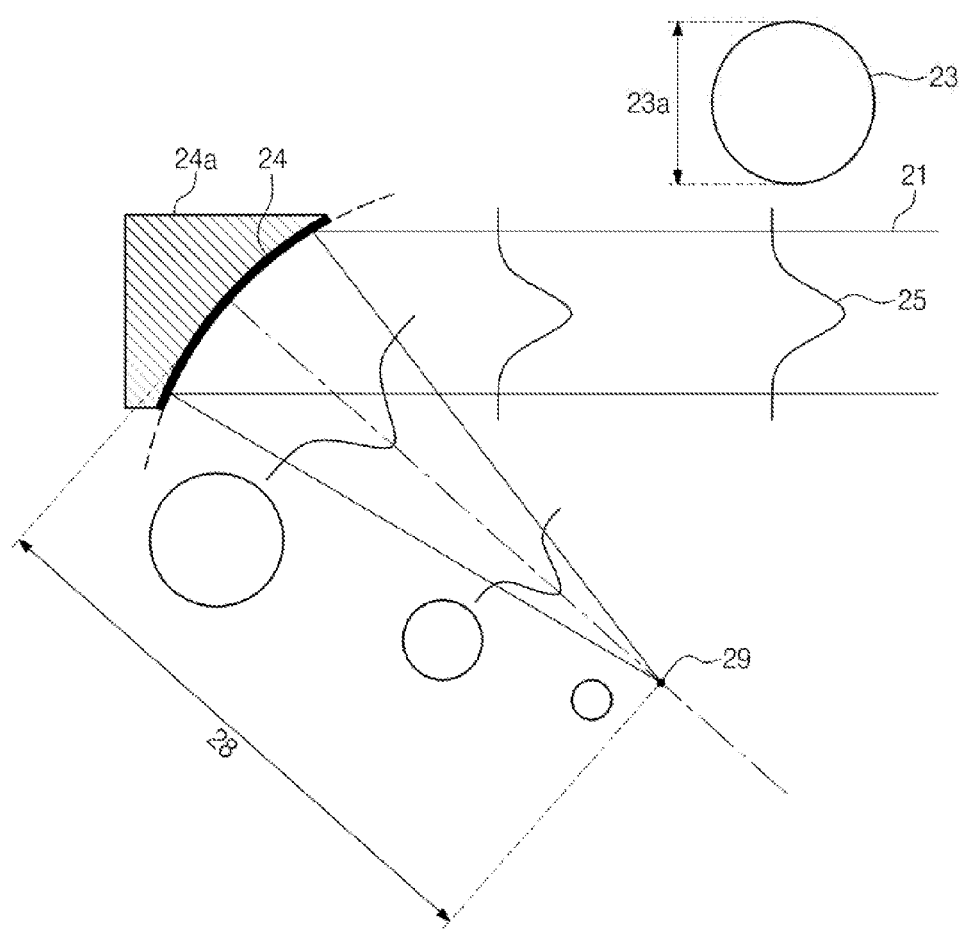
FIGS. 1 to 3 are views illustrating a process of generating an electron beam from a general single wavelength laser beam.

Hereinafter, preferred embodiments of the inventive concept will be described in detail with reference to the accompanying drawings. Advantages and features of the inventive concept, and implementation methods thereof will be clarified through following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Further, the inventive concept is only defined by scopes of claims. Like reference numerals refer to like elements throughout.

Terms used herein are not to limit the inventive concept, but to explain embodiments of the inventive concept. Herein, the terms of a singular form may include plural forms unless referred to the contrary. The meaning of "comprise" and/or "comprising" specifies a property, a region, a fixed number, a step, a process, an element and/or a component but does not exclude other properties, regions, fixed numbers, steps, processes, elements and/or components. Also, a laser beam, an electron beam, a width, wavelength, an optic axis, phase, interference, a spot size, or a cross-section in the specification may be understood in the sense of commonly used terms in the optical field. Since the disclosure is described according to preferred embodiments, reference numerals suggested by an order of the description are not necessarily limited to the order.

Figure 2:
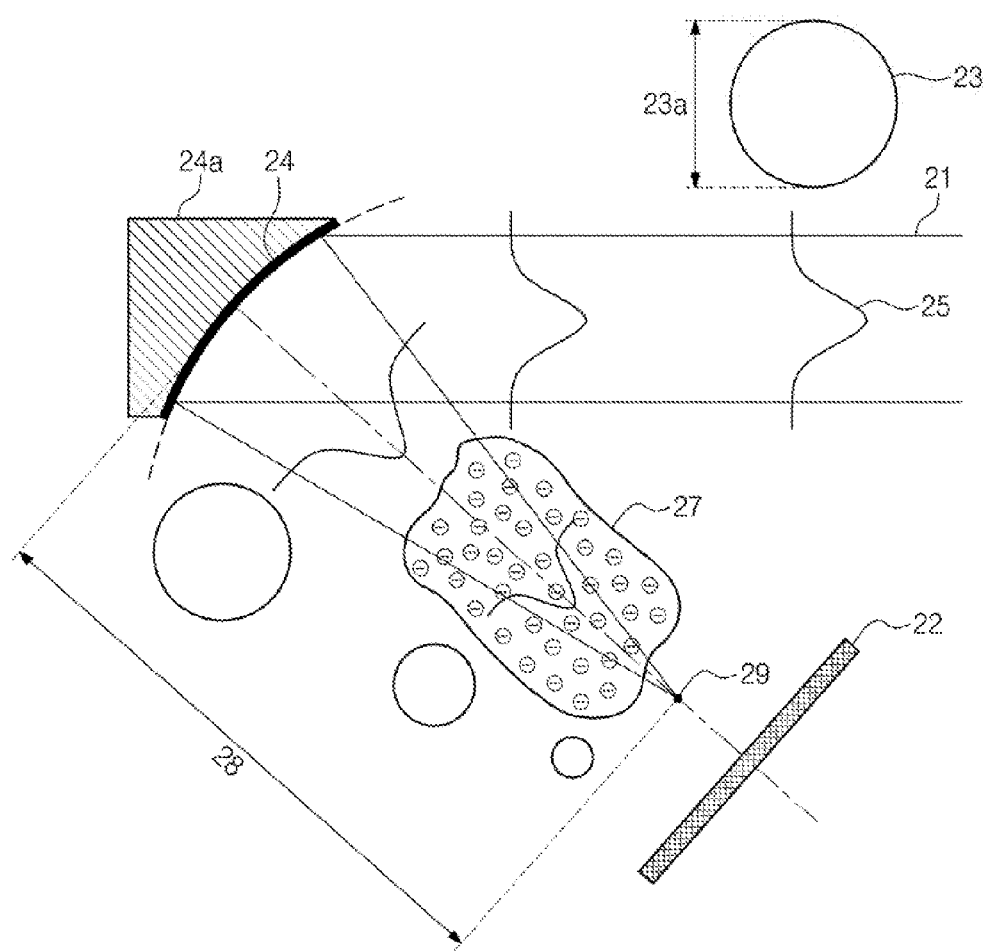
Figure 3:
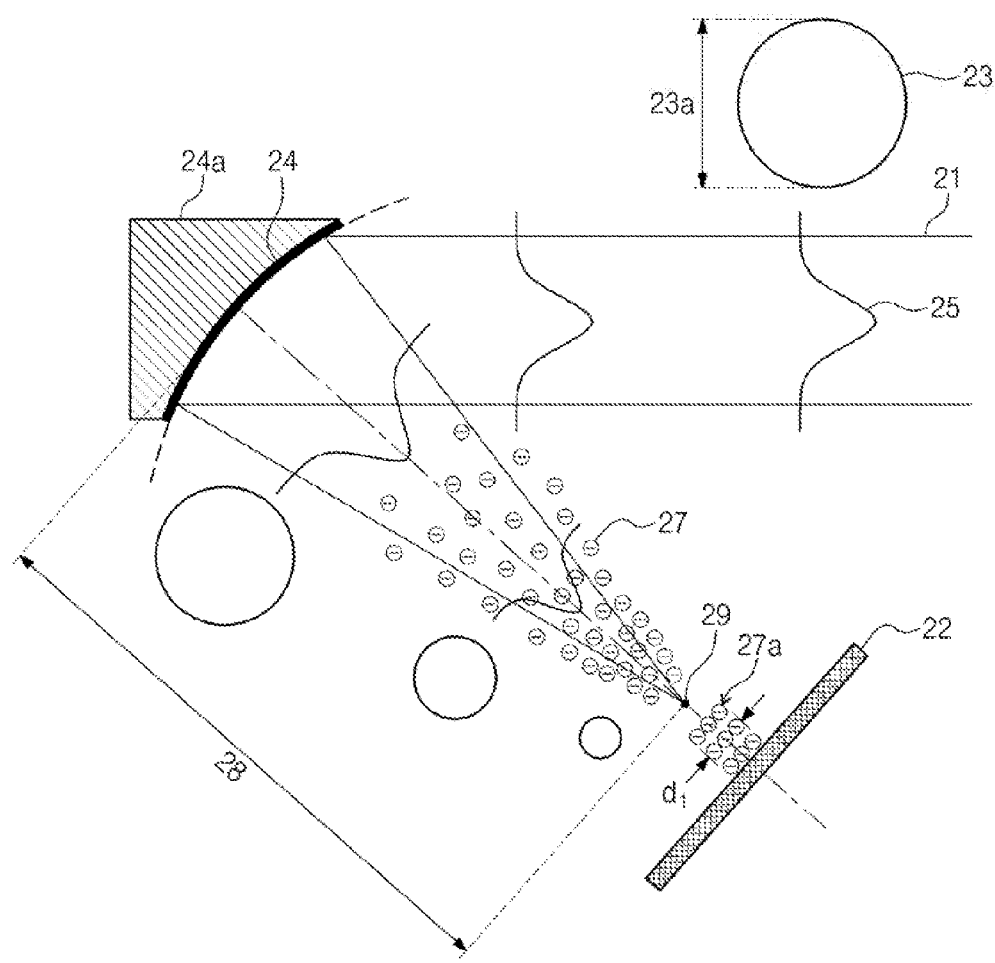

FIGS. 1 to 3 are views illustrating a process of generating an electron beam 27a from a general single wavelength laser beam 21.

Referring to FIG. 1, the single wavelength laser beam 21 may be provided to an off-axis concave mirror 24. The off-axis concave mirror 24 may focus the single wavelength laser beam 21 at a focal point 29. The off-axis concave mirror 24 may be fixed to a supporting structure 24a. An energy intensity distribution 25 of the single wavelength laser beam 21 may be a Gaussian distribution. A cross-section 23 of the single wavelength laser beam 21 may have a circular shape. A spot size 23a of the single wavelength laser beam 21 may be constant before the single wavelength laser beam 21 reaches the off-axis concave mirror 24. However, the spot size 23a may gradually decrease between the off-axis concave mirror 24 and the focal point 29, i.e. along a focal length 28. However, the energy intensity distribution 25 of the single wavelength laser beam 21 may be concentrated to the maximum at the focal point 29. Also, the spot size 23a of the single wavelength laser beam 21 may be greater than the wavelength of the single wavelength laser beam 21 at the focal point 29. That is, the spot size 23a of the single wavelength laser beam 21 may not be smaller than the wavelength of the single wavelength laser beam 21 at the focal point 29.

Referring to FIGS. 2 and 3, electrons 27 may be provided within the focal length 24 of the off-axis concave mirror 24. The electrons 28 may be exposed to the single wavelength laser beam 21. The electrons 27 may be moved to the focal point 29 along the single wavelength laser beam 21 by a pondermotive force and/or the Lorentz force. The pondermotive force and/or the Lorentz force may increase in proportion to the charge amount of the electrons 27 and/or an electric field.

Referring to FIG. 3, the electrons 27 may be densed at the focal point 29. The electrons 27 may be accelerated by the energy of the single wavelength laser beam 21. The accelerated beams 27 may correspond to an electron beam 27a. The electron beam 27a may be provided to a substrate 22. A width d1 of the electron beam 27a may be the same as the spot size 23a of the single wavelength laser beam 21. Hereinafter, spot sizes of beams may correspond to widths of the beams. The width d1 of the electron beam 27a may determine an image resolution of the substrate to be examined. For example, the width d1 of the electron beam 27a may be inversely proportional to the image resolution. The width d1 of the electron beam 27a may not be smaller than the wavelength of the single wavelength laser beam 21. The image resolution may have limitations according to the wavelength of the single wavelength laser beam 21.

Figure 4:
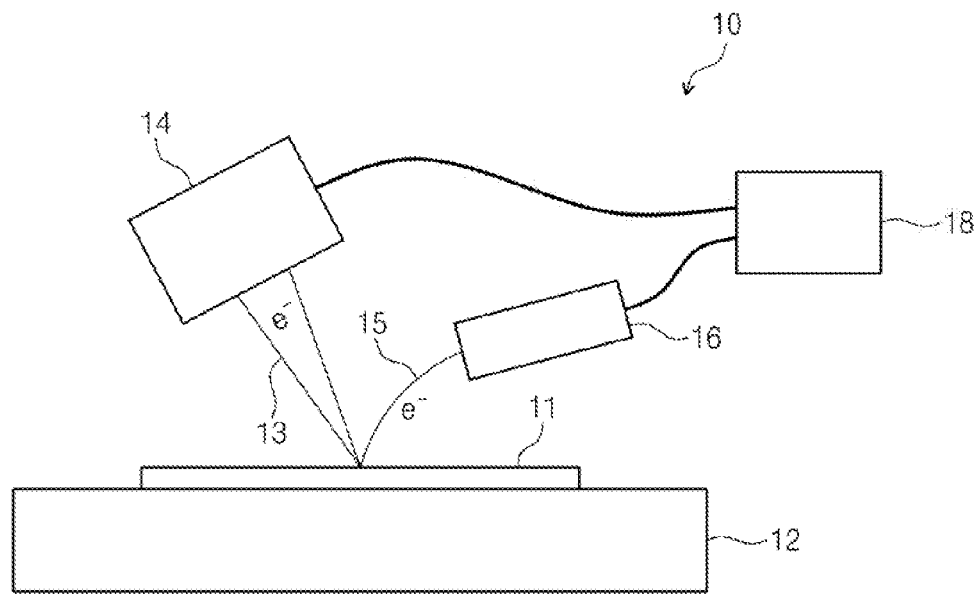
FIG. 4 is a view illustrating an image apparatus according to exemplary embodiments of the inventive concept.

FIG. 4 is a view illustrating an image apparatus 10 according to according to exemplary embodiments of the inventive concept.

Referring to FIG. 4, the image apparatus 10 may be an electron microscope. Alternatively, the image apparatus 10 may be an electron beam exposure apparatus. In exemplary embodiments, the image apparatus 10 may include a stage 12, an electron beam generator 14, a detector 16, and a control unit 18. A substrate 11 may be provided on the stage 12. The stage 12 may move the substrate 11. The electron beam generator 14 may provide an electron beam 13 on the substrate 11. Secondary electrons 15 may be emitted from a surface of the substrate 11 by the electron beam 13. The detector 16 may detect the emitted secondary electrons 15. The control unit 18 may obtain a surface image of the substrate according to a detection signal of the detector 16.

Figure 5:
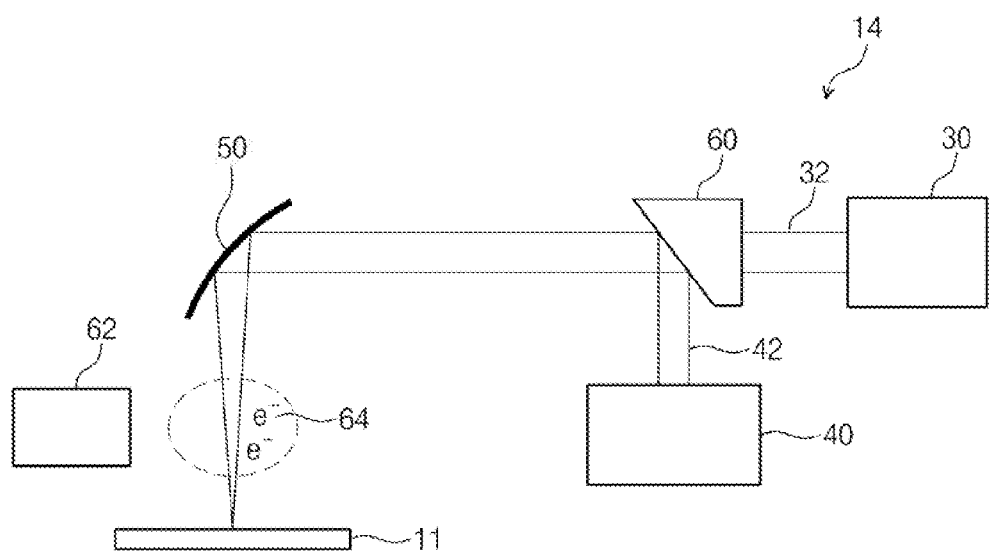
FIG. 5 is a view illustrating an exemplary embodiment of the electron beam generator 14 of FIG. 4.

FIG. 5 is a view illustrating an exemplary embodiment of the electron beam generator 14 of FIG. 4.

Referring to FIG. 5, the electron beam generator 14 may include a first laser apparatus 30, a second laser apparatus 40, a first optical system 50, a second optical system 60, and a beam source supply unit 62.

The first laser apparatus 30 may provide a first laser beam 32 to the first optical system 50. The second laser apparatus 40 may provide a second laser beam 42 in the same optical axis as the first laser beam 32 to the first optical apparatus 50. For example, each of the first and second laser beams 32 and 42 may include a femto second laser beam or a pico second laser beam. Each of the first and second laser beams 32 and 42 may have energy of approximately 20 TW to approximately 1,000 TW.

The first optical system 50 may be disposed between the first and second laser apparatuses 30 and 40 and a substrate 11. The first optical system 50 may reflect the first and second laser beams 32 and 42 to the substrate 11. The first optical system 50 may concentrate the first and second laser beams 32 and 42 on the substrate 11. For example, the first optical system 50 may include an off-axis concave mirror.

The second optical system 60 may be disposed between the first optical system 50 and the first laser apparatus 30, and between the first optical system 50 and the second laser apparatus 40. The second optical system 60 may allow the first and second laser beams 32 and 42 to be overlapped each other. The second optical system 60 may transmit the first laser beam 32. The second optical system 60 may reflect the second laser beam 42 in the same direction as a traveling direction of the first laser beam 32 and/or in an optical axis. In exemplary embodiments, the second optical system 60 may include a half mirror.

The beam source supply unit 62 may provide electrons 64 between the substrate 11 and the first optical system 50. The electrons 64 may be accelerated by the first and second laser beams 32 and 42, and provided to the substrate 11. That is, the electrons 64 may be a beam source of an electron beam (66 of FIG. 9).

Figure 6:
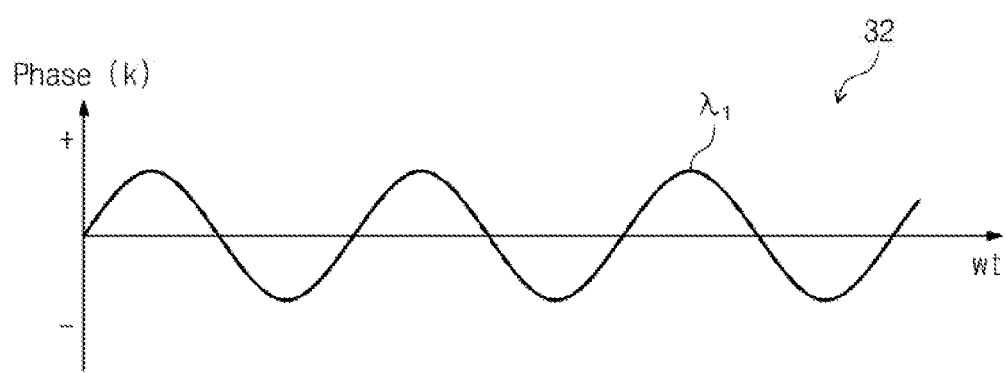
FIG. 6 is a graph illustrating a first wavelength of a first laser beam and a second wavelength of a second laser beam of FIG. 5.
Figure 6:
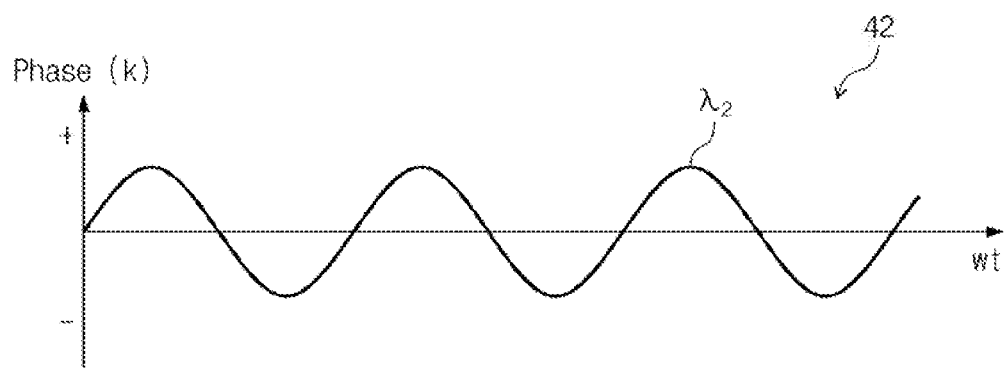

FIG. 6 is a graph showing a first wavelength $\lambda_1$ of the first laser beam 32 and a second wavelength $\lambda_2$ of the second laser beam 42 in FIG. 5.

Referring to FIG. 6, the first wavelength $\lambda_1$ of the first laser beam 32 and the second wavelength $\lambda_2$ of the second laser beam 42 may have different phases each other. In exemplary embodiments, the phase of the first wavelength $\lambda_1$ may be opposite to the phase of the second wavelength $\lambda_2$. That is, each of the first and second laser beams 32 and 42 may have the same wavelength, and may have inverted phases each other. The first wavelength $\lambda_1$ may be shifted to half of the second wavelength $\lambda_2$. The first and second laser beams 32 and 42 may have the same energy.

Figure 7:
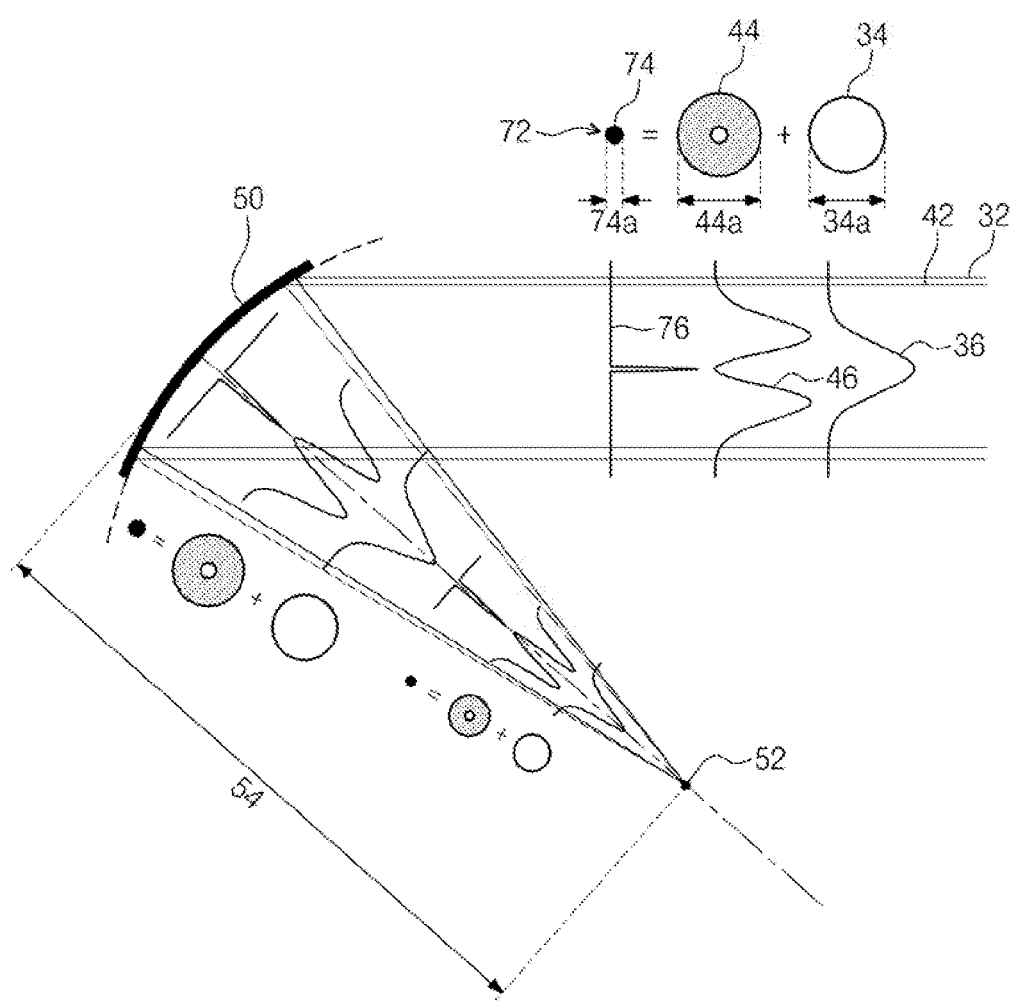
FIGS. 7 to 9 are views illustrating a process of generating an electron beam by the first laser beam and the second laser beam of FIG. 5.
Figure 8:
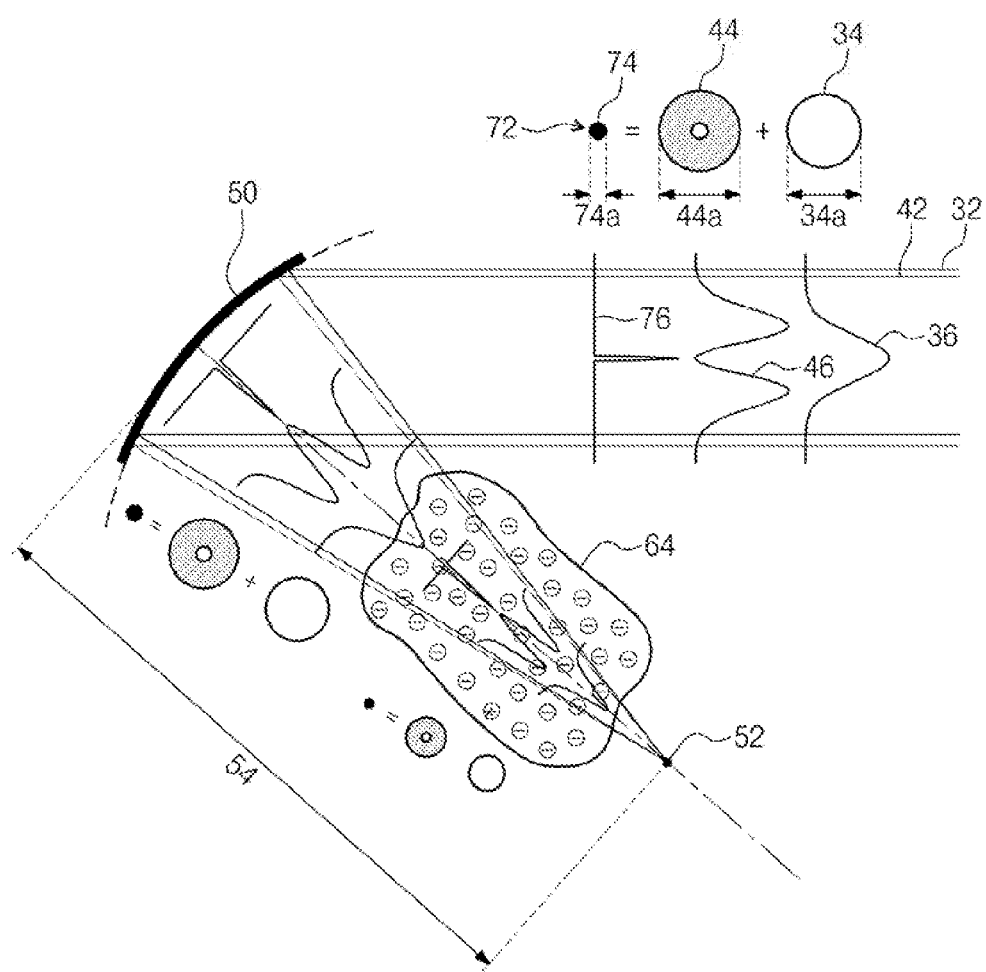
Figure 9:
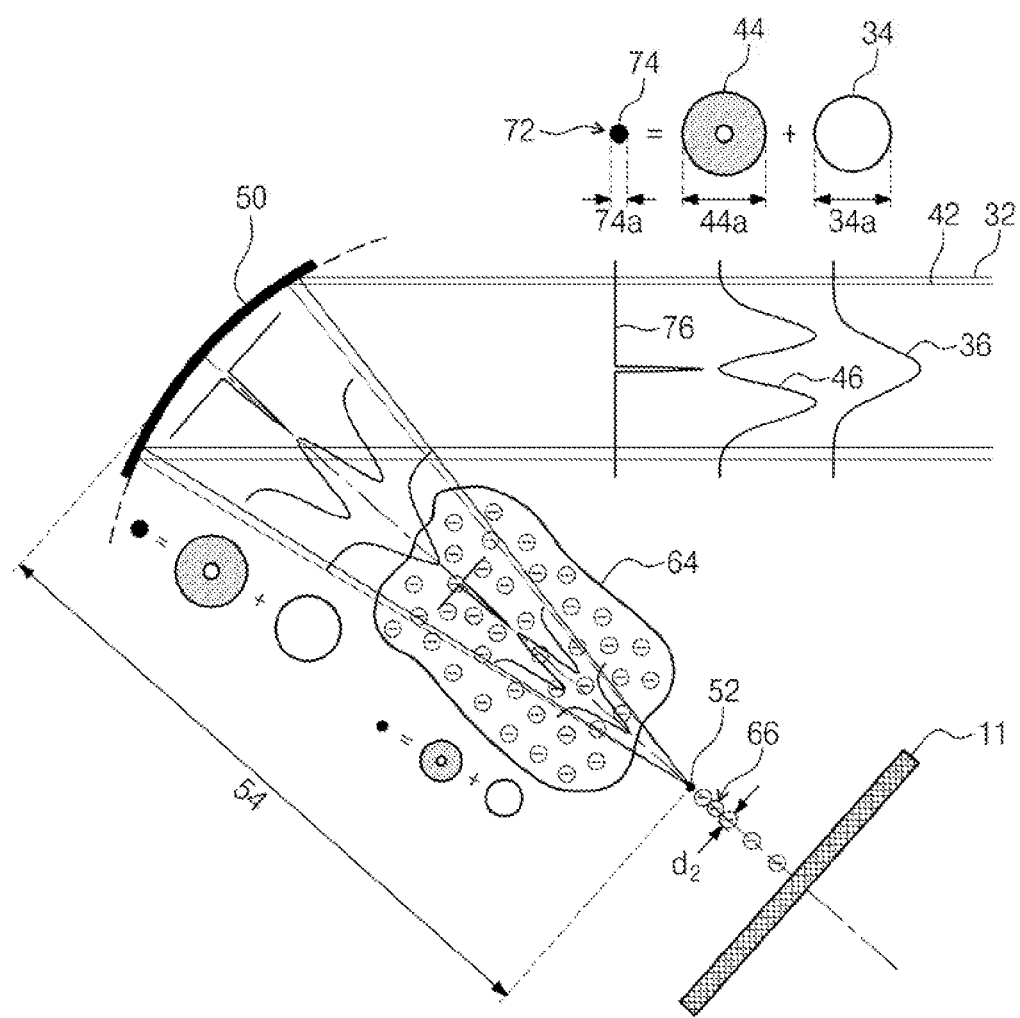

FIGS. 7 to 9 are views illustrating a process of generating an electron beam by using the first and second laser beams 32 and 42 of FIG. 5.

Referring to FIGS. 7 to 9, an interference beam 72 may be generated by a destructive interference between the first and second laser beams 32 and 42. In exemplary embodiments, a cross-section 34 of the first laser beam 32 and a cross-section 44 of the second laser beam 42 may be different from each other. For example, the cross-section 44 of the second laser beam 42 may have a donut and/or ring shape while the cross-section 34 of the first laser beam 32 may have a circular shape. A diameter of the cross-section 34 of the first laser beam 32 may be the same as the diameter of the cross-section 44 of the second laser beam 42. That is, a spot size 34a of the first laser beam 32 may be the same as a spot size 44a of the second laser beam 42. A spot size 74a of the interference beam 72 may be smaller than the spot size 34a of the first laser beam 32 and the spot size 44a of the second laser beam 42. A cross-section 74 of the interference beam 72 may have a circular shape. An energy intensity distribution 36 of the first laser beam 32 may be a Gaussian distribution in the cross-section 34 thereof. The energy intensity distribution 46 of the second laser beam 42 may be a two-humped distribution in the cross-section 44 thereof. The energy intensity distribution 76 of the interference beam 72 may be a Gaussian distribution having a smaller width than the energy intensity distribution 36 of the first laser beam 32 in the cross-section 74 thereof.

The spot size 34a of the first laser beam 32, the spot size 44a of the second laser beam 42, and the spot size 74a of the interference beam 72 may gradually decrease within a focal length 54 of a first optical system 50. For example, the spot size 34a of the first laser beam 32 and the spot size 44a of the second laser beam 42 may decrease to be the same as the wavelength $\lambda_1$ of the first laser beam 32 and the wavelength $\lambda_2$ of the second laser beam 42 at a focal point 52. The spot size 74a of the interference beam 72 may decrease to be smaller than the first wavelength $\lambda_1$ of the first laser beam 32 and the wavelength $\lambda_2$ of the second laser beam 42. Such a principle may be the same as the Stimulated Excitation and Depletion (STED) principle in the optical microscopy.

Referring to FIGS. 8 and 9, electrons 64 may be provided within the focal length 54 of the first optical system 50. The electrons 64 may be densely concentrated on the focal point 52 of the first optical system 50 along the first and second laser beams 32 and 42, and the interference beam 72. The concentrated electrons 64 may be accelerated by energies of the first and second laser beams 32 and 42, and the interference beam 72. For example, the electrons 64 may be accelerated to the maximum speed mainly by the energy of the interference beam 72. The interference beam 72 may generate an electron beam 66 having the same width $d_2$ as the spot size 74a of the interference beam 72.

Figure 10:
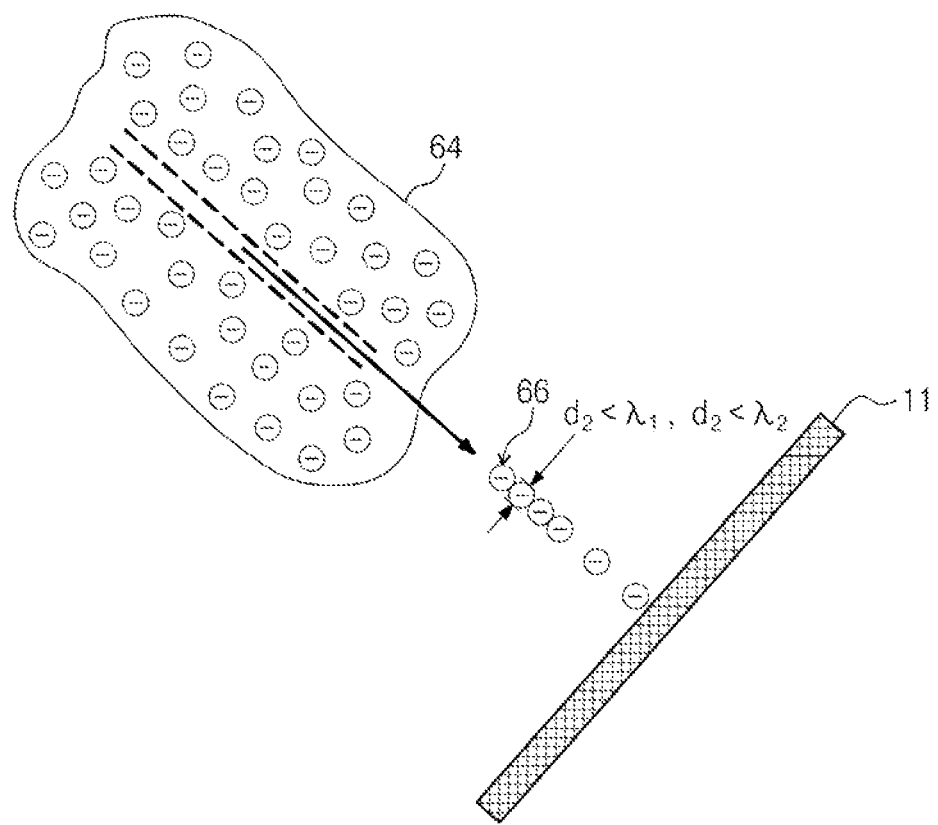
FIG. 10 is a view illustrating a width, a first wavelength, and a second wavelength of the electron beam of FIG. 9.

FIG. 10 is a view illustrating the width $d_2$, and first and second wavelengths $\lambda_1$ and $\lambda_2$ of the electron beam 66 of FIG. 9.

Referring to FIGS. 9 and 10, the width $d_2$ of the electron beam 66 may be smaller than the first and second wavelengths $\lambda_1$ and $\lambda_2$. This is because the spot size 74a of the interference beam 72 is the same as the width $d_2$ of the electron beam 66 and smaller than the first and second wavelengths $\lambda_1$ and $\lambda_2$.

Figure 11:
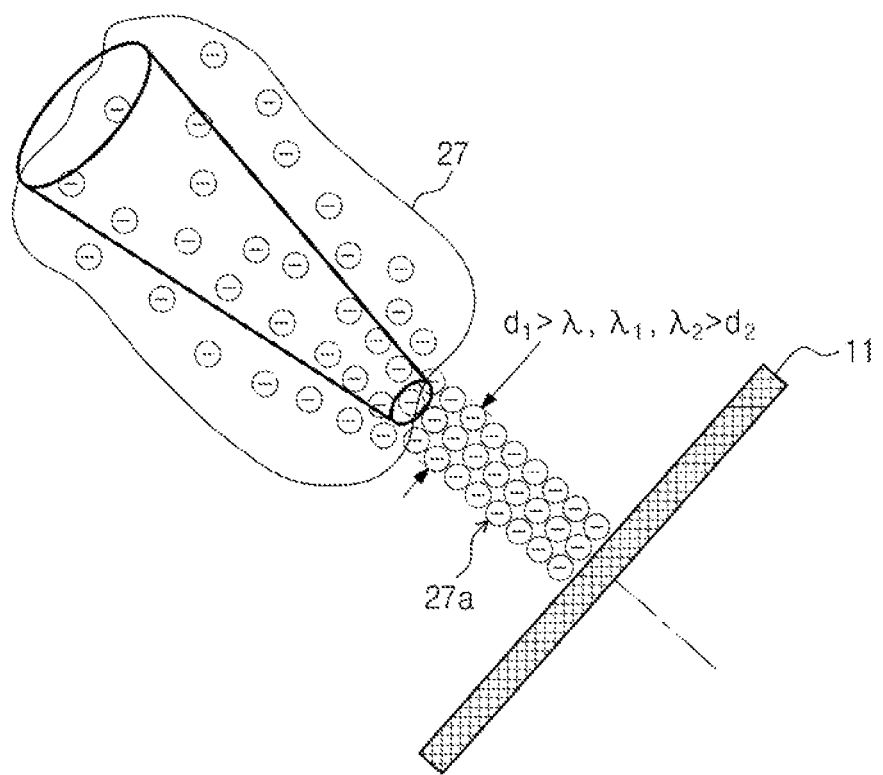
FIG. 11 is a view illustrating a width of the general electron beam and a wavelength of the single wavelength laser beam.

FIG. 11 is a view illustrating a width $d_1$ of a general electron beam 27a and a wavelength $\lambda$ of the single wavelength laser beam of FIG. 3.

Referring to FIGS. 10 and 11, the width $d_1$ of the general electron beam 27a may be greater than the wavelength $\lambda$ of the single wavelength laser beam 21. Meanwhile, the width $d_1$ of the general electron beam 27a may be the same as the wavelength $\lambda$ of the single wavelength laser beam 21. When the wavelength $\lambda$ of the single wavelength laser beam 21 is the same as the first and second wavelengths $\lambda_1$ and $\lambda_2$, the width $d_2$ of the electron beam 66 may be smaller than the width $d_1$ of the general electron beam 27a.

Referring back to FIGS. 4 and 10, a control unit 18 may obtain a high resolution image by the electron beam 66. This is because the resolution of an image is inversely proportional to the width $d_2$ of the electron beam 66.

Figure 12:
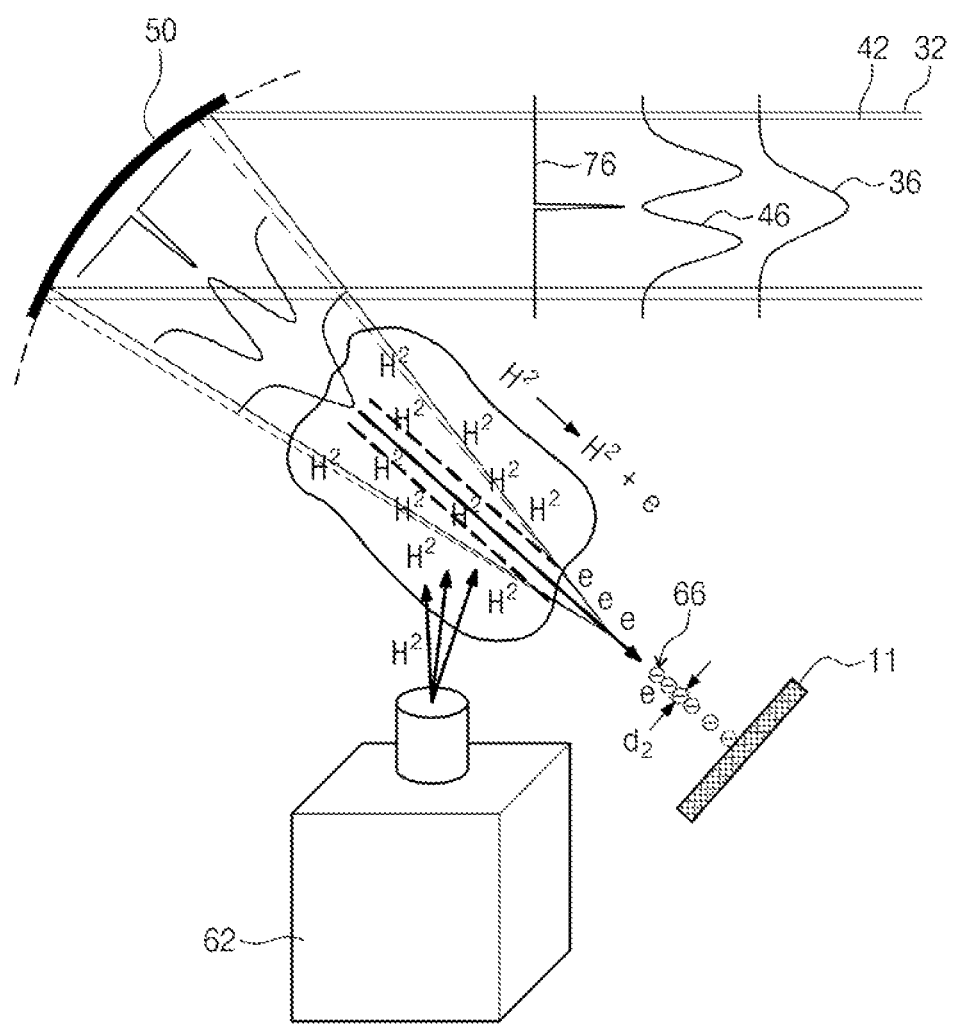
FIG. 12 is a view illustrating an example of a beam source supply unit of FIG. 5.

FIG. 12 is a view illustrating an example of the beam source supply unit 62 of FIG. 5.

Referring to FIG. 12, the beam source supply unit 62 may provide hydrogen gas $H_2$ within the focal length 54 of the first optical system 50. The hydrogen gas $H_2$ may be charged with hydrogen ions $H^+$ by the first second laser beams 32 and 42, and the interference beam 72. The first and second laser beam 32 and 42, and the interference beam 72 may generate the electrons 64 from the hydrogen gas $H_2$. The electrons 64 may be accelerated toward the electron beam 66 by the interference beam 72. The electron beam 66 may have a smaller width $d_2$ than the first and second wavelengths $\lambda_1$ and $\lambda_2$.

Figure 13:
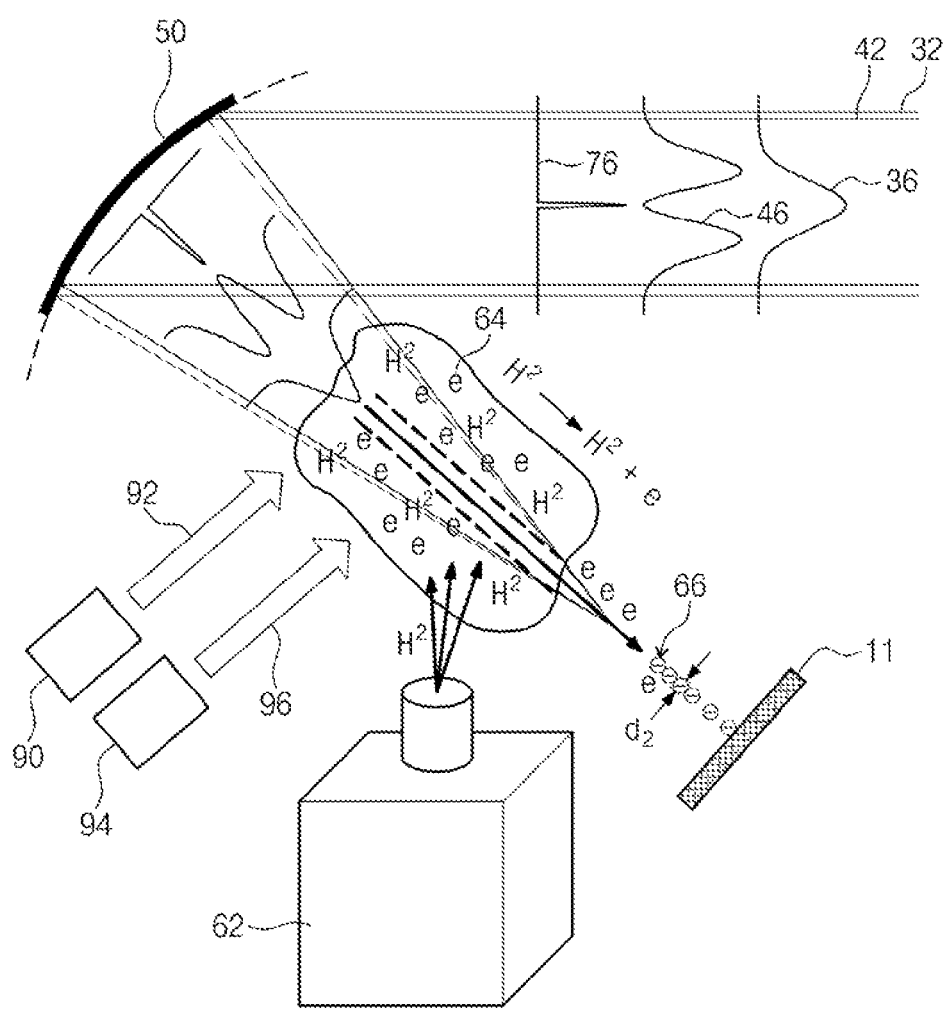
FIG. 13 is a view illustrating an example of the electron beam generator of FIG. 5.

FIG. 13 is a view illustrating an example of the electron beam generator 14 of FIG. 5.

Referring to FIG. 13, the electron beam generator 14 may include a power supply unit 90 and a third laser apparatus 94. The power supply unit 90 may provide high frequency power 92 to hydrogen gas $H_2$ between the first optical system 50 and the substrate 11. The hydrogen gas $H_2$ may generate the electrons 64. The power supply unit 90 may include an electron cyclotron resonance unit. The third laser apparatus 94 may provide a third laser beam 96 to the hydrogen gas $H_2$. The third laser beam 96 may excite the hydrogen gas $H_2$ to generate the electrons 64.

First and second laser beams 32 and 42 may be the same as those of FIGS. 7 to 9.

As described above, an electron beam generator according to exemplary embodiments of the inventive concept may generate an electron beam having a smaller line width than a wavelength of a laser beam due to a destructive interference of laser beams. An image apparatus may obtain a high-resolution image using the electron beam having the smaller line width than the wavelength of the laser beam.

While this disclosure has been particularly shown and described with reference to preferred embodiments thereof, it will be understood by those skilled in the art that various changes in form and details may be made therein without departing from the spirit and scope of the inventive concept as defined by the appended claims. Therefore, it should be understood that the embodiments and applications disclosed herein are exemplified in all aspects, and should not be construed as limiting the technical idea of the inventive concept.

What is claimed is:

1. An electron beam generator comprising:
   a beam source supply unit configured to provide a beam source on a substrate;
   a first laser apparatus configured to provide a first laser beam to the beam source and the substrate;
   a first optical system having a focal point on the substrate and configured to concentrate the first laser beam on the substrate; and a second laser apparatus configured to provide a second laser beam overlapping the first laser beam between the first optical system and the first laser apparatus;

wherein the second laser apparatus outputs the second laser beam which has a phase opposite to a phase of the first laser beam, and decreases a first spot size of an interference beam generated by a destructive interference with the first laser beam to be smaller than a wavelength of the first laser beam at the focal point.

2. The electron beam generator of claim 1, wherein the first laser beam and the second laser beam have a second spot size and a third spot size which are larger than the first spot size, respectively, and the second spot size is the same as the third spot size.

3. The electron beam generator of claim 1, wherein the first laser beam has a first cross-section and the second laser beam has a second cross-section having a different shape from the first cross-section.

4. The electron beam generator of claim 3, wherein when the first cross-section has a circular shape, the second cross-section has a donut or ring shape having the same diameter as the first cross-section.

5. The electron beam generator of claim 1, wherein the first optical system comprises an off-axis concave mirror.

6. The electron beam generator of claim 1, further comprising a second optical system disposed between the first optical system and the first laser apparatus, and configured to provide the second laser beam in the same direction as the direction in which the first laser beam is provided.

7. The electron beam generator of claim 6, wherein the second optical system comprises a half mirror.

8. The electron beam generator of claim 1, wherein the beam source comprises hydrogen gas.

9. The electron beam generator of claim 8, further comprising a high frequency supply apparatus configured to provide high frequency power to the hydrogen gas.

10. The electron beam generator of claim 9, wherein the high frequency supply apparatus comprises an electron cyclotron resonance unit.

11. The electron beam generator of claim 8, further comprising a third laser apparatus configured to provide a third laser beam to the hydrogen gas.

12. An image apparatus comprising:
an electron beam generator configured to provide an electron beam on a substrate;
a detector configured to detect secondary electrons generated from the substrate using the electron beam; and
a control unit configured to control the electron beam generator and obtain a substrate image according to a detection signal of the detector,
wherein the electron beam generator comprises:
a source supply unit configured to provide a beam source to the substrate;
a first laser apparatus configured to provide a first laser beam to the beam source and the substrate;
a first optical system having a focal point on the substrate and configured to concentrate the first laser beam on the substrate; and
a second laser apparatus configured to provide a second laser beam overlapping the first laser beam between the first optical system and the first laser apparatus;
wherein the second laser apparatus outputs the second laser beam which has a phase opposite to a phase of the first laser beam, and decreases a first spot size of an interference beam generated by a destructive interference with the first laser beam to be smaller than a wavelength of the first laser beam at the focal point.

13. An optical apparatus comprising:
first and second laser apparatuses configured to provide first and second laser beams to a substrate; and
a first optical system provided between the first and second laser apparatuses and the substrate, and configured to focus the first and second laser beams,
wherein the first and second laser beams are overlapped with each other to generate an interference beam, and decrease a spot size of the interference beam to be smaller than a wavelength of each of the first and second laser beams at a focal point of the first optical system.

14. The optical apparatus of claim 13, wherein the first laser beam has a first cross-section having a circular shape, and the second laser beam has a second cross-section having a donut or ring shape and the same diameter as the first cross-section.

15. The optical apparatus of claim 14, wherein the interference beam has a third cross-section having a circular shape and a smaller diameter than the first cross-section.

16. The optical apparatus of claim 14, wherein the first laser beam has an energy intensity distribution of the Gaussian distribution in the first cross-section, the second laser beam has an energy intensity distribution of a two-humped distribution in the second cross-section, and the interference beam has an energy distribution of the Gaussian distribution having a smaller width than the width of the energy intensity distribution of the first laser beam.

17. The optical apparatus of claim 13, wherein each of the first and second laser beams has the same spot size as each other.

18. The optical apparatus of claim 13, wherein each of the first and second laser beams has the same wavelength as each other.

19. The optical apparatus of claim 13, wherein each of the first and second laser beams has an inverted phase as each other.

20. The optical apparatus of claim 13, further comprising a second optical system disposed between the first and second laser apparatuses and the first optical system, and configured to allow the first and second laser beams to be overlapped each other, wherein the second optical system comprises a half mirror.

* * * * *